US008093956B2

(12) United States Patent
Feng et al.

(10) Patent No.: US 8,093,956 B2
(45) Date of Patent: Jan. 10, 2012

(54) CIRCUIT FOR ADJUSTING THE TEMPERATURE COEFFICIENT OF A RESISTOR

(75) Inventors: Xiaoxin Feng, Shakopee, MN (US); Jeffrey Loukusa, Hamel, MN (US)

(73) Assignee: Honeywell International Inc., Morristown, NJ (US)

( * ) Notice: Subject to any disclaimer, the term of this patent is extended or adjusted under 35 U.S.C. 154(b) by 204 days.

(21) Appl. No.: 12/352,100

(22) Filed: Jan. 12, 2009

(65) Prior Publication Data

US 2010/0176886 A1 Jul. 15, 2010

(51) Int. Cl.
*H03L 1/02* (2006.01)

(52) U.S. Cl. .......................... 331/176; 331/66; 331/185

(58) Field of Classification Search .................... 331/66, 331/176, 185, 186

See application file for complete search history.

(56) References Cited

U.S. PATENT DOCUMENTS

| | | | |
|---|---|---|---|
| 3,899,695 A | 8/1975 | Solomon et al. | |
| 4,114,053 A | 9/1978 | Turner | |
| 4,229,753 A | 10/1980 | Bergeron et al. | |
| 4,258,311 A | 3/1981 | Tokuda et al. | |
| 4,853,610 A | 8/1989 | Schade, Jr. | |
| 4,956,567 A | 9/1990 | Hunley et al. | |
| 5,038,053 A | 8/1991 | Djenguerian et al. | |
| 5,125,112 A | 6/1992 | Pace et al. | |
| 5,319,536 A | 6/1994 | Malik | |
| 5,386,160 A | 1/1995 | Archer et al. | |
| 6,333,238 B2 | 12/2001 | Baldwin et al. | |
| 6,351,111 B1 | 2/2002 | Laraia | |
| 6,664,166 B1 | 12/2003 | Jaiswal et al. | |
| 6,798,024 B1 | 9/2004 | Hemmenway et al. | |
| 7,511,589 B2 * | 3/2009 | Tarng | 331/117 R |
| 7,557,665 B2 * | 7/2009 | Chung et al. | 331/66 |
| 2007/0164844 A1 | 7/2007 | Lin et al. | |

OTHER PUBLICATIONS

Brokaw, "A Simple Three-Terminal IC Bandgap Reference", IEEE Journal of Solid State Circuits, vol. SC-9, No. 6, Dec. 1974, pp. 388-393, Institute of Electrical and Electronics Engineers (IEEE) publishers.

J. Chen & B. Shi, "New Approach to CMOS Current Reference with Very Low Temperature Coefficient", Great Lakes Symposium on Very Large Scale Integration (GLSVLSI) '03 Proceedings, Apr. 2003, pp. 281-284, Washington, DC, Association for Computing Machinery (ACM) publishers.

Cadence Design Systems, Inc. "Virtuoso Spectre Circuit Simulator Datasheet", 2008, available at http://www. cadence.com/rl/Resources/datasheets/virtuoso_mmsim.pdf#page=5 (last visited Jan. 12, 2009).

P. Hills, "The Spice Circuit Simulator and Models", V2.07, Jul. 29, 2004, available at http://homepages.which.net/~paul.hills/Circuits/Spice/SpiceBody.html (last visited Jan. 12, 2009).

Glaser & Subak-Sharpe, "Integrated Circuit Engineering: Design, Fabrication, and Applications", Addison-Wesley publishers, 1977, p. 22.

* cited by examiner

*Primary Examiner* — Robert Pascal
*Assistant Examiner* — James E Goodley
(74) *Attorney, Agent, or Firm* — Shumaker & Sieffert, P.A.

(57) ABSTRACT

A temperature-compensated-resistance (TCR) circuit, which may be part of an integrated circuit, is provided. The TCR circuit consists of two resistors and a diode. The two resistors are connected in parallel and the diode is connected in series with one of the resistors. The two parallel legs of the TCR circuit may be connected to a reference voltage source, such as a ground. No specialized devices, such as bipolar transistors, Zener or Schottky diodes, or specially-processed resistors, are required by the TCR circuit. The resistors and the diode of the TCR circuit may be chosen to adjust for temperature variations in the resistance values of the resistor, leading to a negative, zero, or positive temperature coefficient of resistance for the circuit. A phase-locked loop (PLL) circuit is described as an application of the TCR circuit.

19 Claims, 2 Drawing Sheets

CIRCUIT FOR ADJUSTING THE TEMPERATURE COEFFICIENT OF A RESISTOR

GOVERNMENT LICENSE RIGHTS

This invention was made with U.S. Government support under Contract No. F09603-02-D-0055-0006 (Subcontract No. 4400183573). The U.S. Government may have certain rights in this invention.

FIELD OF THE INVENTION

This invention relates to electrical circuitry and electronics circuitry generally, and specifically to circuits designed for different temperature coefficients.

BACKGROUND

Resistors used in integrated circuits, such as Complementary Metal Oxide Semiconductor (CMOS) integrated circuits, typically have a positive temperature coefficient. That is, the resistance of the resistor increases as the temperature increases. However, the use of resistors with positive temperature coefficients is not always desirable. Adding complex circuitry to adjust the temperature coefficient of resistors on an integrated circuit (IC) may increase the cost and/or power requirements of the IC, while decreasing chip density.

A large number of prior art devices have been developed to adjust for temperature variations. Some of those prior art devices include bandgap circuits such as described in Brokaw, "A Simple Three-Terminal IC Bandgap Reference", IEEE Journal of Solid State Circuits, Vol. SC-9, No. 6, December 1974, pp. 388-393 ("Brokaw"), J. Chen and B. Shi, "New Approach to CMOS Current Reference with Very Low Temperature Coefficient", Great Lakes Symposium on Very Large Scale Integration (GLSVLSI) '03 Proceedings, pp. 281-84, Washington, D.C., Association for Computing Machinery (ACM) Publishers ("Chen and Shi"), and in U.S. Pat. No. 6,351,111 ("Laraia"). Also, several prior art temperature compensation circuits utilize specialized devices, such as bipolar transistors, Schottky diodes, and/or Zener diodes, such as described in U.S. Pat. No. 3,899,695 ("Solomon"), U.S. Pat. No. 4,114,053 ("Turner"), U.S. Pat. No. 4,229,753 ("Bergeron"), U.S. Pat. No. 4,258,311 ("Tokuda"), U.S. Pat. No. 4,853,610 ("Schade"), U.S. Pat. No. 4,956,567 ("Hunley"), U.S. Pat. No. 5,038,053 ("Djenguerian"), U.S. Pat. No. 5,125,112 ("Pace"). See also U.S. Pat. No. 5,386,160 ("Archer") (utilizing current mirrors for temperature compensation), U.S. Pat. No. 6,333,238 ("Baldwin"), and U.S. Pat. No. 6,798,024 ("Hemmenway") (Baldwin and Hemmenway describing fabrication methods for minimizing temperature coefficients). One prior art circuit, described in U.S. Patent App. No. 2007/0164844 ("Lin"), utilizes negative-temperature-coefficient and positive-temperature-coefficient resistors.

Also, many of the prior art devices can compensate for temperature only as a zero temperature coefficient (ZTC) circuit (e.g., Turner and Lin) or combine complementary-to-absolute-temperature (CTAT) and proportional-to-absolute-temperature (PTAT) currents to achieve temperature compensation (e.g., Djenguerian). What is needed is a simple, flexible circuit design that does not require the use of specialized devices to achieve negative, zero, or positive temperature compensation.

SUMMARY

Embodiments of the present application include circuitry. A first embodiment of the invention is a circuit. The circuit consists of a first resistor, a second resistor, and a diode. The first resistor has a first resistance value. The second resistor has a second resistance value. The second resistor is connected in parallel to the first resistor. The diode is connected in series with the second resistor.

A second embodiment of the invention is a phase-locked loop. The phase-locked loop includes an amplifier, a voltage-controlled oscillator (VCO), a first transistor, a second transistor and a temperature-compensated-resistance circuit. The first transistor is connected to the amplifier. The second transistor is connected to the first transistor, the amplifier, and the VCO. The temperature-compensated-resistance circuit is connected to the amplifier and the first transistor. The temperature-compensated-resistance circuit includes a first resistor, a second resistor, and a diode. The first resistor has a first resistance value. The second resistor has a second resistance value. The second resistor is connected in parallel to the first resistor. The diode is connected in series with the second resistor. The first resistor and the diode are both connected to a reference-voltage source.

A third embodiment of the invention is an integrated circuit. The integrated circuit includes a temperature-compensated-resistance circuit. The temperature-compensated-resistance circuit includes a first resistor, a second resistor, and a diode. The first resistor has a first resistance value. The second resistor has a second resistance value. The second resistor is connected in parallel to the first resistor. The diode is connected in series with the second resistor.

BRIEF DESCRIPTION OF THE DRAWINGS

Various examples of embodiments are described herein with reference to the following drawings, wherein like numerals denote like entities, in which.

DETAILED DESCRIPTION

A temperature-compensated-resistance (TCR) circuit, which may be part of an integrated circuit, is provided. The TCR circuit consists of two resistors and a diode. The two resistors are connected in parallel and the diode is connected in series with one of the resistors. The resistors and the diode may be chosen to adjust for temperature variations in the resistance values of the resistor, leading to a negative, zero, or positive temperature-coefficient of resistance for the circuit. The invention comprises a mathematical model for determining the resistance values and voltages usable for a negative, zero, or positive temperature-coefficient in the TCR circuit. The TCR circuit does not require the use of specialized devices—such as bipolar transistors, Schottky diodes, Zener diodes, negative temperature coefficient resistors, and/or other specially processed resistors—to achieve temperature compensation. Rather the temperature-compensated-resistance circuit merely requires use of standard CMOS process devices—two resistors and a single diode.

The TCR circuit's simplicity and flexibility as either a negative, zero, or positive temperature-coefficient circuit allow for uses in a variety of electrical applications. One such application—a phase-locked loop utilizing the TCR circuit to generate a PTAT current—is described herein in as a detailed application of the TCR circuit. Other specific circuits related to the phase-locked loop disclosed herein, including delay elements and delay-locked loops, can be readily designed by those skilled in the art based on the disclosed TCR circuit.

However, as those skilled in the art will readily appreciate, the TCR circuit has wide applicability to most CMOS circuits. The TCR circuit can be incorporated into Application Specific Integrated Circuits (ASICs) as well as standard integrated and non-integrated circuits. The end-uses of the TCR circuit include commercial, military, and space applications where temperature-compensated resistance is required.

Figure 1:
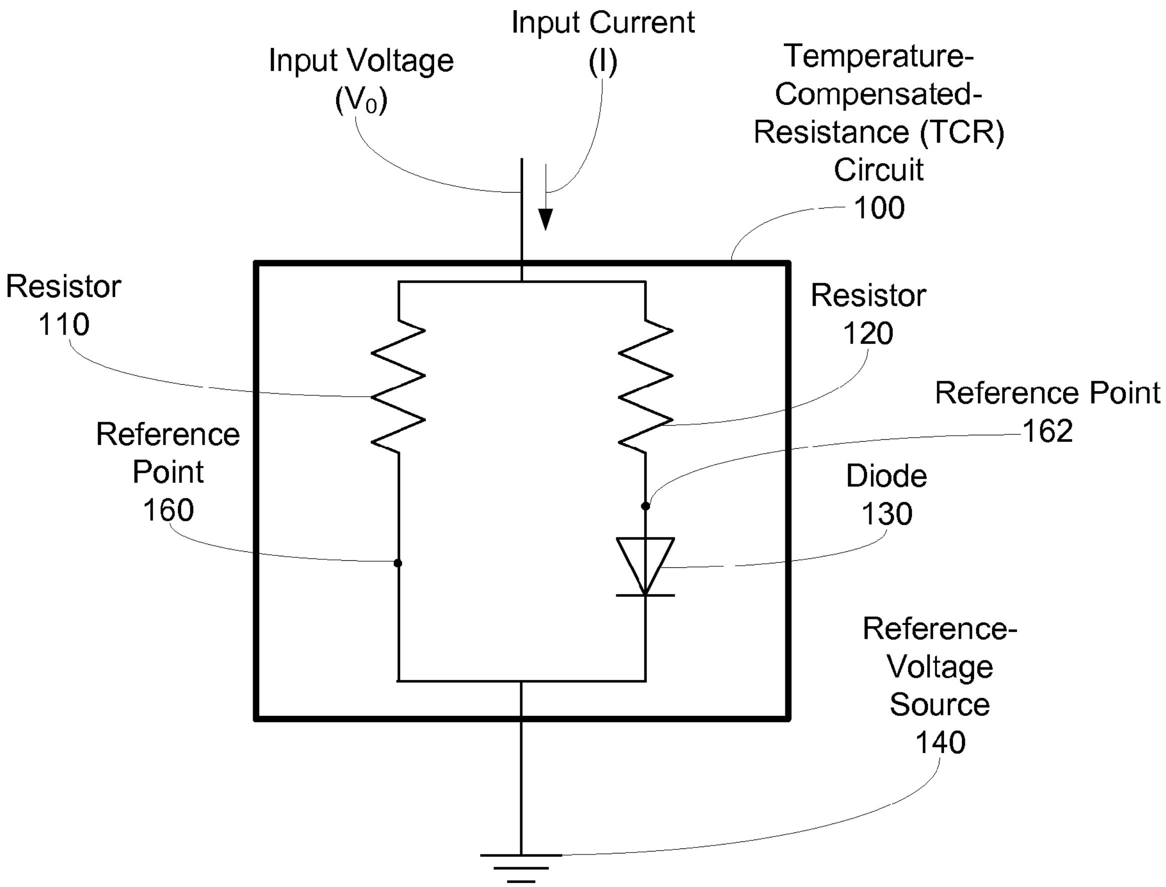
FIG. 1 is a diagram of a temperature-compensated-resistance circuit, in accordance with embodiments of the invention

Turning to the figures, FIG. 1 shows a temperature-compensated-resistance (TCR) circuit 100, in accordance with embodiments of the invention. The TCR circuit 100, shown in FIG. 1 inside a solid-line rectangle for clarity, consists of a resistor 110 connected in parallel with another resistor 120 and a diode 130 connected in series. The resistor 110 leg and the diode 130 of the TCR circuit 100 are both connected to a reference-voltage source 140. The reference-voltage source 140 shown in FIG. 1 is a ground voltage source, but other reference-voltage sources are possible as well. The TCR circuit 100 may be realized using standard devices and/or on an integrated circuit, such as but not limited to a CMOS integrated circuit.

The resulting temperature coefficient of the TCR circuit 100 is adjusted by choosing component values and the input current. For example, let:

$T_0$=a reference temperature

T=a temperature of interest $R_{10}$=the resistance of resistor 110 at temperature $T_0$, $R_{20}$=the resistance of resistor 120 at temperature $T_0$, and $\alpha$=the temperature coefficient for resistors 110 and 120.

Then, the resistance $R_1$ of resistor 110 at temperature T is:

$$R_1=R_{10}[1+\alpha(T-T_0)]=R_{10}(A+BT), \text{ where } A \text{ and } B \text{ are positive constants.} \tag{1}$$

Similarly, the resistance $R_2$ of resistor 120 at temperature T is:

$$R_2=R_{20}[1+\alpha(T-T_0)]=R_{20}(A+BT). \tag{2}$$

Also, when power is applied to the TCR circuit 100 at temperature T with an input voltage $V_0$ and an input current I, $$V_0=I_1R_1, \text{ where } I_1 \text{ is the current flowing at reference point } \mathbf{160}. \text{ Then,} \tag{3a}$$

$$V_0=I_2R_2+V_d \tag{3b}$$

where $I_2$ is the current flowing at reference point 162 and $V_d$ is the voltage drop across the diode 130.

Then, equating (3a) and (3b)

$$V_0=I_1R_1=I_2R_2+V_d \tag{3}$$

where $V_d$ can be determined by:

$$V_d = V_T \ln\left(\frac{I_2}{I_s}\right). \tag{4}$$

Then, according to Glaser and Subak-Sharpe, $$\frac{dI_s}{dT} \cong \frac{I_s V_{g0}}{T V_T} \tag{5}$$

where $V_{g0}$ is the gap voltage for the diode 130 at a temperature of 0° Kelvin (for example, $V_{g0}$=1.21 V for silicon), $I_s$ is the saturation current for the diode 130, and $V_T$ is the thermal voltage for the diode 130. Glaser and Subak-Sharpe, "Integrated Circuit Engineering: Design, Fabrication, and Applications", Addison-Wesley, 1977, p. 22 (see Equation 2.13), which is incorporated by reference for all purposes.

Generally, $V_{g0} \geqq V_d$ (for example, for silicon, $V_d \approx 0.7$ V). The thermal voltage $V_T$ at temperature T may be determined by the equation:

$$V_T = \frac{kT}{q} \tag{5a}$$

where: k=the Boltzmann constant and q=the magnitude of electrical charge on an electron.

Also, as the resistor 110 leg and the resistor 120 legs are in parallel:

$$I=I_1+I_2. \tag{6}$$

From equations (4), (5), and (5a), the change in voltage with respect to temperature $$\frac{dV_d}{dT}$$

is:

$$\begin{aligned} \frac{dV_d}{dT} &= \frac{d(kT/q)}{dT}\ln\left(\frac{I_2}{I_s}\right) + V_T\frac{d(\ln(I_2/I_s))}{dT} \\ &= \frac{V_d}{T} + V_T\frac{I_s}{I_2}\frac{I_s(dI_2/dT) - I_2(dI_s/dT)}{I_s^2} \\ &= \frac{V_d}{T} + \frac{V_T}{I_2}\frac{dI_2}{dT} - \frac{V_{g0}}{T}. \end{aligned} \tag{7}$$

From equations (1) and (3), $$\left.\frac{dV_0}{dT}\right|_{I=const} = R_{10}I_1B + R_1\frac{dI_1}{dT} \text{ or solving (8) for } \frac{dI_1}{dT}, \quad \frac{dI_1}{dT} = \frac{1}{R_1}\left[\frac{dV_0}{dT} - R_{10}I_1B\right] \tag{8}$$

Then, combining equations (2), (3), (6), (7), and (8):

$$\begin{aligned} \left.\frac{dV_0}{dT}\right|_{I=const} &= R_{20}I_2B + R_2\frac{dI_2}{dT} + \frac{dV_d}{dT} \\ &= R_{20}I_2B - \frac{V_{g0}}{T} + \frac{V_d}{T} + \left(\frac{R_2}{R_1} + \frac{V_T}{R_1I_2}\right) \\ &\quad R_{10}I_1B - \left(\frac{R_2}{R_1} + \frac{V_T}{R_1I_2}\right)\frac{dV_0}{dT}. \end{aligned} \tag{9}$$

Solving for $$\frac{dV_0}{dT},$$

get:

$$\left(1 + \frac{R_2}{R_1} + \frac{V_T}{R_1I_2}\right)\left.\frac{dV_0}{dT}\right|_{I=const} = R_{20}I_2B - \frac{V_{g0}}{T} + \frac{V_d}{T} + \left(\frac{R_2}{R_1} + \frac{V_T}{R_1I_2}\right)R_{10}I_1B. \tag{10}$$

Equation (10) indicates that the TCR circuit 100 output voltage could have a negative, zero, or positive temperature coefficient $$\left.\frac{dV_0}{dT}\right|_{I=const}$$

based solely on the choices of the resistances $R_1$ and $R_2$ (and corresponding resistances $R_{10}$ and $R_{20}$ at temperature $T_0$) for respective resistors 110 and 120, the diode 130, and the input current I. For example, by choosing resistors 110 and 120 and diode 130 such that $$\left.\frac{dV_0}{dT}\right|_{I=const}$$

is 0, the temperature dependency of the TCR circuit 100 is eliminated. Similarly, in an application where a negative temperature dependency is required, resistors 110 and 120 and diode 130 could be chosen appropriately according to Equation (10).

The designer of an application circuit utilizing TCR circuit 100 may consider application requirements before determining specific resistance and voltage values to be used for resistor 110, resistor 120, and diode 130. For example, the application requirements may specify the input current I, input voltage $V_0$, and/or an effective resistance for the TCR circuit 110.

Further, depending on application requirements of the application, additional effects, such as $2^{nd}$ and $3^{rd}$ order effects of voltage and temperature on the components of the TCR circuit 100, may have to be considered. As those skilled in the art are aware, the additional effects can readily be considered via simulation of the application circuit and/or the TCR circuit. Preferably, the simulation is run using the SPECTRE simulation software made by Cadence Design Systems, Inc. of San Jose, Calif.

The designer may make choices about the TCR circuit 100 that affect the specific components used in TCR circuit 100. For example, the designer may specify a ratio or percentage or current ratio between the legs of the TCR circuit; e.g., 60% of the current goes through resistor 120 and diode 130 (and so 40% of the current goes through resistor 110) or a 1:1 current ratio between the two legs of the TCR circuit 100. The designer may also choose a voltage ratio or percentage between the voltage drops of resistor 120 and diode 130; e.g., ⅔ of the total voltage drop is due to diode 130 and ⅓ of the total voltage drop is due to resistor 120.

After taking application requirements into account and making design choices, the designer may then choose specific components for resistor 110, resistor 120, and diode 130 based on the analysis provided by equations (1)-(10) above. See below for examples of specific components used in a phase-locked loop application circuit.

Figure 2:
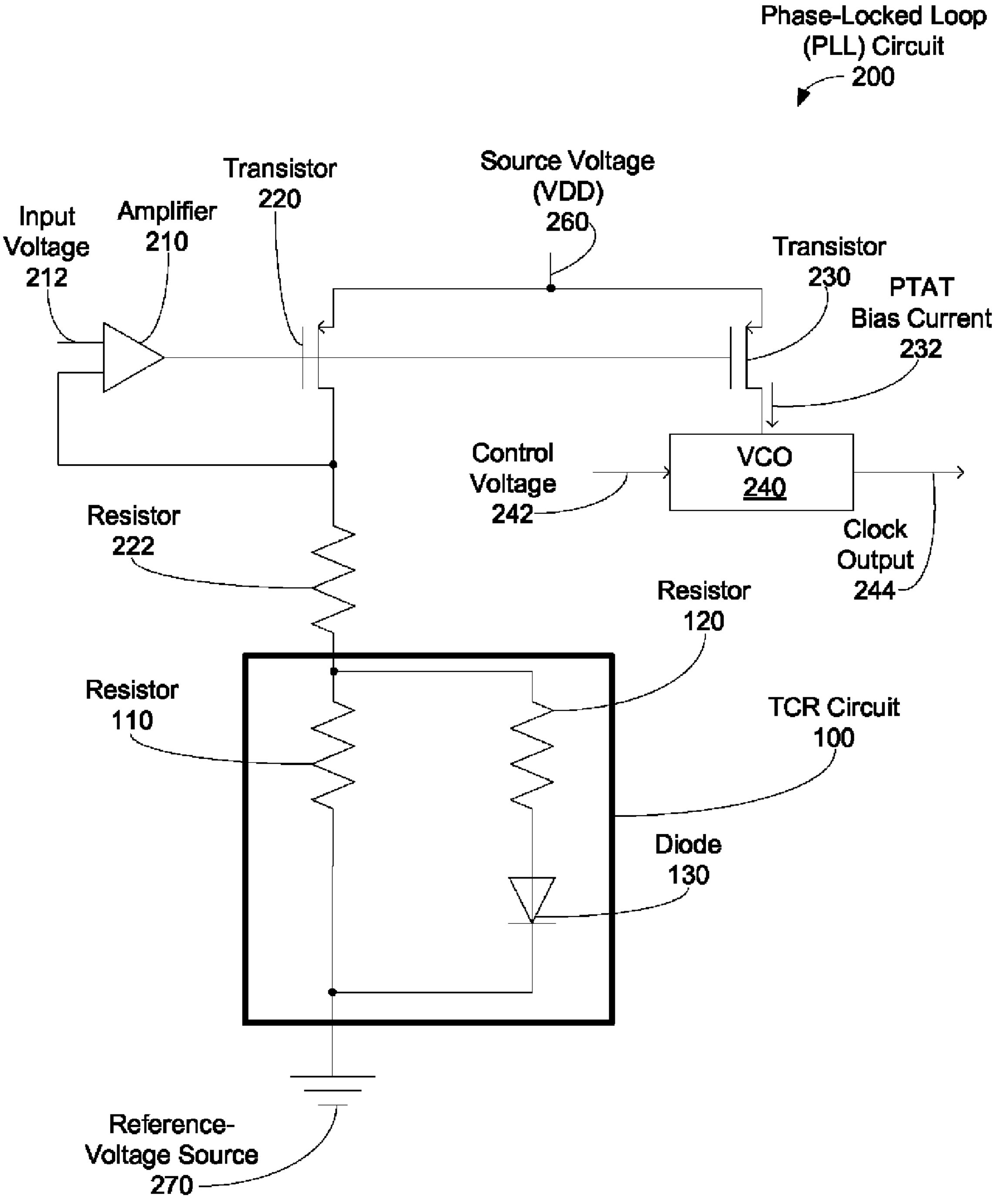
FIG. 2 is a diagram of a phase-locked loop circuit, in accordance with embodiments of the invention.

FIG. 2 shows a phase-locked loop (PLL) circuit 200 utilizing the TCR circuit 100, in accordance with embodiments of the invention. The PLL circuit 200 includes an amplifier 210, transistors 220 and 230, a voltage-controlled oscillator 240, and the TCR circuit 100, shown in FIG. 2 inside a solid-line rectangle for clarity.

An input voltage 212 may be applied to the inverting input of the amplifier 210. The input voltage 212 may represent a reference signal. The clock output 244 may have a fixed relation to the control voltage 242. The non-inverting input of the amplifier 210 may be connected to a reference-voltage source 270 (e.g., a ground) via resistor 222 and the TCR circuit 100.

The output of the amplifier 210 may be coupled to the gates of both transistors 220 and 230. The sources of both transistors 220 and 230 may be coupled to a source voltage 260. The drain of transistor 220 may be connected in series to both the resistor 222 and the TCR circuit 100, which is in turn connected to a reference-voltage source 270 (i.e., a ground voltage). The drain of the transistor 230 may be connected to the VCO 240, and as such, supply a bias current 232 to the VCO 240.

The use of the TCR circuit 100 in the PLL circuit 200 ensures that the bias current 232 supplied to the VCO 240 is a proportional-to-absolute-temperature (PTAT) bias current 232. The use of a PTAT bias current 232 as a bias current to VCO 240 may increase a usable frequency range of the VCO 240. For example, when resistor 222 has a resistance of 8 KΩ, resistor 110 has a resistance of 16 KΩ, and resistor 120 has a resistance of 1 KΩ when the input voltage 212 is 1.2V, the usable frequency range of the VCO 240 may be increased more than 50% beyond that of a similar PLL circuit not using the temperature-compensated-resistance circuit. In this example, the choices for resistor 110 and resistor 120 lead to the TCR circuit 100 having a negative-temperature coefficient. Then, the negative-temperature coefficient of the TCR circuit 100 enables the bias current 232 to be proportional to absolute temperature.

CONCLUSION

Exemplary embodiments of the present invention have been described above. Those skilled in the art will understand, however, that changes and modifications may be made to the embodiments described without departing from the true scope and spirit of the present invention, which is defined by the claims. It should be understood, however, that this and other arrangements described in detail herein are provided for purposes of example only and that the invention encompasses all modifications and enhancements within the scope and spirit of the following claims. As such, those skilled in the art will appreciate that other arrangements and other elements (e.g. machines, interfaces, functions, orders, and groupings of functions, etc.) can be used instead, and some elements may be omitted altogether. Further, many of the elements described herein are functional entities that may be implemented as discrete or distributed components, in conjunction with other components, and in any suitable combination and location.

The invention claimed is:

1. A temperature-compensated resistance circuit, comprising:

a first resistor with a first resistance value ($R_1$);

a second resistor with a second resistance value ($R_2$), connected in parallel with the first resistor, wherein the first resistor and the second resistor are both connected to an input-voltage source; and a diode, connected in series with the second resistor, wherein the first resistor and the diode are both connected to a reference-voltage source;

wherein the first resistance value and the second resistance value are selected such that a resistance between the input-voltage source and the reference-voltage source has a predetermined temperature coefficient;

wherein the first resistance value is a function of temperature, defined approximately by:

$$R_1=R_{10}[1+\alpha_1(T-T_{01})],$$

wherein $R_{10}$ is a value of the first resistance value at temperature $T_{01}$, $\alpha_1$ is a temperature coefficient of the first resistor, and T is a temperature of interest;

wherein the second resistance value is a function of temperature, defined approximately by:

$$R_2=R_{20}[1+\alpha_2(T-T_{02})],$$

wherein $R_{20}$ is the value of the second resistance value at temperature $T_{02}$ and $\alpha_2$ is a temperature coefficient of the second resistor.

2. The circuit of claim 1, wherein the predetermined temperature coefficient is positive.

3. The circuit of claim 1, wherein the predetermined temperature coefficient is zero.

4. The circuit of claim 1, wherein the predetermined temperature coefficient is negative.

5. The circuit of claim 1, further including of a third resistor connected in series to the first resistor.

6. A phase-locked loop, comprising:

an amplifier;

a voltage controlled oscillator (VCO);

a first transistor, connected to the amplifier;

a second transistor, connected to the first transistor, the amplifier, and the VCO; and a temperature-compensated-resistance circuit, connected to the amplifier and to the first transistor, comprising:

a first resistor with a first resistance value ($R_1$), a second resistor with a second resistance value ($R_2$), connected in parallel to the first resistor, wherein the first resistor and the second resistor are both connected to an input-voltage source, and a diode, connected in series with the second resistor, wherein the first resistor and the diode are both connected to a reference-voltage source, and wherein the first resistance value and the second resistance value are selected such that a resistance between the input-voltage source and the reference-voltage source has a predetermined temperature coefficient;

wherein the first resistance value is a function of temperature, defined approximately by:

$$R_1=R_{10}[1+\alpha_1(T-T_{01})],$$

wherein $R_{10}$ is a value of the first resistance value at temperature $T_{01}$, $\alpha_1$ is a temperature coefficient of the first resistor, and T is a temperature of interest;

wherein the second resistance value is a function of temperature, defined approximately by:

$$R_2=R_{20}[1+\alpha_2(T-T_{02})],$$

wherein $R_{20}$ is the value of the second resistance value at temperature $T_{02}$, and $\alpha_2$ is a temperature coefficient of the second resistor.

7. The phase-locked loop of claim 6, wherein the second transistor provides a proportional-to-absolute-temperature (PTAT) current to the VCO.

8. The phase-locked loop of claim 7, wherein the VCO is configured to generate a clock output based on the PTAT current.

9. The phase-locked loop of claim 6, wherein the predetermined temperature coefficient is positive.

10. The phase-locked loop of claim 6, wherein the predetermined temperature coefficient is zero.

11. The phase-locked loop of claim 6, wherein the predetermined temperature coefficient is negative.

12. The phase-locked loop of claim 6, wherein the phase-locked loop is a Complementary-Metal-Oxide Semiconductor (CMOS) circuit.

13. The phase-locked loop of claim 6, further comprising a third resistor connected in series to the temperature-compensated-resistance circuit.

14. The phase-locked loop of claim 6, wherein the reference-voltage source comprises a ground.

15. An integrated circuit, comprising:

a temperature-compensated-resistance circuit comprising:

a first resistor with a first resistance value ($R_1$);

a second resistor with a second resistance value ($R_2$), connected in parallel with the first resistor, wherein the first resistor and the second resistor are both connected to an input-voltage source; and a diode, connected in series with the second resistor, wherein the first resistor and the diode are both connected to a reference-voltage source;

wherein the first resistance value and the second resistance value are selected such that a resistance between the input-voltage source and the reference-voltage source has a predetermined temperature coefficient;

wherein the first resistance value is a function of temperature, defined approximately by:

$$R_1=R_{10}[1+\alpha_1(T-T_{01})],$$

wherein $R_{19}$ is a value of the first resistance value at temperature $T_{01}$, $\alpha_1$ is a temperature coefficient of the first resistor, and T is a temperature of interest;

wherein the second resistance value is a function of temperature, defined approximately by:

$$R_2=R_{20}[1+\alpha_2(T-T_{02})],$$

wherein $R_{20}$ is the value of the second resistance value at temperature $T_{02}$, and $\alpha_2$ is a temperature coefficient of the second resistor.

16. The integrated circuit of claim 15, wherein the predetermined temperature coefficient is positive.

17. The integrated circuit of claim 15, wherein the predetermined temperature coefficient is negative.

18. The integrated circuit of claim 15, wherein the predetermined temperature coefficient is zero.

19. The integrated circuit of claim 15, wherein the integrated circuit is a Complementary-Metal-Oxide Semiconductor (CMOS) integrated circuit.

* * * * *

UNITED STATES PATENT AND TRADEMARK OFFICE

CERTIFICATE OF CORRECTION

PATENT NO. : 8,093,956 B2
APPLICATION NO. : 12/352100
DATED : January 10, 2012
INVENTOR(S) : Xiaoxin Feng It is certified that error appears in the above-identified patent and that said Letters Patent is hereby corrected as shown below:

In the Claims:

Col. 8, Claim 15, Line 36, "wherein R19 is" should be -- wherein R10 is --

Signed and Sealed this
Thirteenth Day of August, 2013

Teresa Stanek Rea
*Acting Director of the United States Patent and Trademark Office*